(12) United States Patent
Gudeman et al.

(10) Patent No.: US 7,972,683 B2
(45) Date of Patent: Jul. 5, 2011

(54) WAFER BONDING MATERIAL WITH EMBEDDED CONDUCTIVE PARTICLES

(75) Inventors: Christopher S. Gudeman, Lompoc, CA (US); Steven H. Hovey, Santa Barbara, CA (US); Ian R. Johnston, Ventura, CA (US)

(73) Assignee: Innovative Micro Technology, Goleta, CA (US)

( * ) Notice: Subject to any disclaimer, the term of this patent is extended or adjusted under 35 U.S.C. 154(b) by 668 days.

(21) Appl. No.: 11/896,648

(22) Filed: Sep. 5, 2007

(65) Prior Publication Data

US 2007/0295456 A1    Dec. 27, 2007

Related U.S. Application Data

(63) Continuation-in-part of application No. 11/390,085, filed on Mar. 28, 2006.

(51) Int. Cl.
*H01L 29/12* (2006.01)
*B29C 65/48* (2006.01)
*H01B 1/02* (2006.01)

(52) U.S. Cl. .............. 428/208; 428/620; 156/379.9; 252/500; 252/520.3; 252/521.2; 430/200

(58) Field of Classification Search .............. 428/426, 428/428, 446, 704; 430/200
See application file for complete search history.

(56) References Cited

U.S. PATENT DOCUMENTS

| | | | |
|---|---|---|---|
| 3,795,047 A | 3/1974 | Abolafia et al. | |
| 4,113,981 A | 9/1978 | Fujita et al. | |
| 6,165,386 A * | 12/2000 | Endo et al. | 252/500 |
| 6,625,032 B1 * | 9/2003 | Ito et al. | 361/751 |
| 6,844,959 B2 * | 1/2005 | Huibers et al. | 359/297 |
| 6,911,720 B2 * | 6/2005 | Yamazaki et al. | 257/678 |
| 2003/0157426 A1 * | 8/2003 | Jordan et al. | 430/200 |
| 2004/0146719 A1 * | 7/2004 | Baney et al. | 428/426 |
| 2004/0182285 A1 * | 9/2004 | Mazany et al. | 106/600 |
| 2006/0083896 A1 * | 4/2006 | McKinnell et al. | 428/141 |
| 2007/0238262 A1 | 10/2007 | Summers | |
| 2007/0262428 A1 | 11/2007 | Summers | |

OTHER PUBLICATIONS http://www.thefreedictionary.com/malleable (Oct. 7, 2010).*

* cited by examiner

*Primary Examiner* — Betelhem Shewareged
*Assistant Examiner* — Sathavaram I Reddy
(74) *Attorney, Agent, or Firm* — Jaquelin K. Spong

(57) ABSTRACT

A material for bonding a first wafer to a second wafer, which includes an insulating adhesive with conductive particles embedded in the adhesive substance. When the adhesive is applied and melted or fused, and pressure is applied between the first wafer and the second wafer, the first wafer approaches the second wafer until a minimum separation is reached, defined by a dimension of the conductive particles. Each of the first wafer and the second wafer may have circuitry formed thereon, and the conductive particles may form a conductive path between the circuitry on one wafer and the circuitry on the other wafer. Advantageously, the high fusing temperature required by the insulating adhesive may also serve to activate a getter material, formed in the device cavity between the first wafer and the second wafer.

20 Claims, 7 Drawing Sheets

WAFER BONDING MATERIAL WITH EMBEDDED CONDUCTIVE PARTICLES

CROSS REFERENCE TO RELATED APPLICATIONS

This application is a continuation-in-part of U.S. patent application Ser. No. 11/390,085, filed Mar. 28, 2006, which is hereby incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to a microelectromechanical systems (MEMS) device and its method of manufacture. More particularly, this invention relates to a material and process for bonding MEMS wafers with a protective lid wafer.

Microelectromechanical systems (MEMS) are very small moveable structures made on a substrate using lithographic batch processing techniques, such as those used to manufacture semiconductor devices. MEMS devices may be moveable actuators, sensors, valves, pistons, or switches, for example, with characteristic dimensions of a few microns to hundreds of microns. A moveable MEMS switch, for example, may be a cantilevered beam which connects one or more input terminals to one or more output terminals, all microfabricated on a substrate. The actuation means for the moveable cantilevered beam switch may be thermal, piezoelectric, electrostatic, or magnetic, for example.

Because the MEMS devices often have moveable components, such as the cantilevered beam, they typically require protection of the vulnerable moveable portions by sealing the devices under a protective cap or lid wafer, to form an encapsulated MEMS device. Furthermore, the MEMS device may be designed to operate in a particular ambient environment. For example, a MEMS switch handling high voltages may be required to operate in an electrically insulating environment. For this reason, the MEMS switch may be encapsulated with an electrically insulating gas. In order to prevent the preferred gas environment from leaking out over the lifetime of the switch, the environment may need to be sealed hermetically when the MEMS device wafer and the lid wafer are bonded.

The lid wafer may be secured to the device wafer by some adhesive means, such as a low outgassing epoxy. To fabricate the encapsulated MEMS device, a second wafer upon which the MEMS devices have been fabricated is placed against a first, lid wafer. Adhesive may have been placed on the second wafer or the first wafer, or both. The second wafer is pressed against the first wafer, and heat is applied to fuse or cure the adhesive. After curing, the second wafer and first wafer bonded assembly is generally sawed to singulate the individual devices.

Many adhesives such as epoxies, cements and glues are liquid during application, and only harden upon curing. Alternatively, an adhesive such as a solder or metal can be melted until it flows, and then cooled to harden. In either case, the adhesive may need to be a liquid at some point in order to accommodate variations in the surfaces of the first wafer and the second wafer and securely bond the surfaces. The liquid will, in general, flow outward from the bond region during assembly, such that a rigid feature or standoff may need to be provided in the first wafer or second wafer to define a minimum separation between the first wafer and the second wafer. The separation may be that required to accommodate the height of the MEMS device, as well as some additional room to provide a tolerance to allow movement of the MEMS device.

FIG. 1 shows an example of a portion of a prior art first wafer for forming the protective lid for a MEMS device and having a standoff to define the minimum separation between a first wafer and a second wafer. The MEMS device 140, is shown only schematically in FIG. 1, and has been previously formed on the second wafer 150. The first wafer 160 is processed to form a recessed region 170. This recess is sufficiently deep to provide clearance for the MEMS device 140 and its movement. The recess 170 may be formed, for example, by reactive ion etching the surface of the first wafer 160, after appropriate patterning with photoresist. During formation of recess 170, the mechanical standoffs 120 may be formed by protecting these areas from the reactive ion etching process. Alternatively, standoffs 120 may be formed by depositing a material, such as a metal film, in these regions.

The second wafer 150 is generally bonded to the first wafer 160 with an adhesive bond, using a wafer bonding tool. To achieve the adhesive bond, a layer of adhesive 110 is deposited on the cap or first wafer 160, or on the second wafer 150, around the perimeter of the MEMS device 140. The second wafer and first wafer may be aligned so that the standoff features 120 are properly placed with respect to the MEMS devices 140, and clamped together to form the wafer assembly 100. The wafer assembly 100 may then mounted in the wafer bonding tool. The assembly 100 may then be heated to liquefy or cure the adhesive 110. Because of the pressure, the liquid adhesive 110 flows outward from the bond region, allowing the second wafer 150 and the first wafer 160 to come within a minimum distance defined by the standoffs 120. The assembly 100 is allowed to remain stationary until the second wafer 150 is permanently bonded to the first wafer 160. The assembly 100 is then cooled and removed from the wafer bonding tool. The devices are subsequently singulated, to form the individual eancapsulated MEMS devices.

Using the approach illustrated in FIG. 1, the first wafer 160 must be processed to form the standoffs 120 before alignment and bonding to the second wafer 150. This processing may take the form of one or more additional photolithography steps, such as deposition of photoresist, patterning of the photoresist, and followed by etching of the first wafer 160. These additional steps add cost and complexity to the formation of the encapsulated MEMS device.

SUMMARY

Materials and processes are described here which address the above-mentioned problems, and may be particularly applicable to the formation of MEMS devices fabricated on a first wafer and encapsulated with a second wafer. The materials and processes described herein use non-melting rigid particles mixed in an adhesive substance to form a bonding material, and the bonding material is then applied to one or both the first wafer and the second wafer. The adhesive substance of the bonding material bonds the first wafer to the second wafer to form a hermetic seal around a device cavity which encapsulates the MEMS device. Upon melting, fusing or curing the adhesive substance, the rigid particles in the bonding material define a minimum separation between the first wafer and the second wafer. Accordingly, there is no need to fabricate the standoffs on the first or second wafer to define the minimum separation between the wafers, thus saving manufacturing time and expense.

The bonding material therefore bonds a first wafer to a second wafer, and includes an adhesive substance which adheres the first wafer to the second wafer and at least one rigid particle in the adhesive substance, which defines a minimum separation between the first wafer and the second wafer. In one exemplary embodiment, the rigid particles are conductive, and therefore provide a conductive path between the first wafer and the second wafer, through an insulating adhesive. In this embodiment, a vacuum environment may be maintained in the device cavity by the deposition of a getter material within the cavity. The insulating adhesive may then be, for example, a glass frit, which requires a relatively high temperature to fuse and bond the first wafer to the second wafer. The act of fusing the frit may therefore also activate the getter, by heating it to a temperature at which it desorbs gases, and is ready to operate to maintain the vacuum environment in the device cavity. Accordingly, in this embodiment, the bonding of the wafers and the activation of the getter material may take place simultaneously.

The conductive particles may be of a diameter chosen to provide an appropriate distance between the wafers. Alternatively, the rigid particles may be provided in at least two groups: a first group of conductive particles and a second group of smaller diameter, more rigid particles. The first group of conductive particles may provide the conductive path between the two wafers, whereas the second group of harder particles may determine the minimum spacing between the two wafers.

The conductive particles may be made of, for example, aluminum (Al), nickel (Ni), copper (Cu), platinum (Pt), tungsten (W), or gold (Au), or metal-coated dielectric spheres, or hollow metal spheres, for example, and have a diameter between about 1 µm and about 100 µm, and more preferably about 30 µm. The rigid particles may be made of, for example, sapphire, diamond, or silica, and may have a diameter about 5 µm smaller than the conductive particles. The rigid particles may be sufficiently rigid to maintain their shape under the processing conditions required to use the bonding material. The insulating adhesive may include, for example, glass frit and polymeric materials such as epoxy. Upon the melting or fusing of the adhesive and the pressing of the wafers together, a minimum separation is defined by the presence of the particles in the adhesive, between the wafers, and the getter is activated by the high temperatures.

The adhesive with incorporated conductive particles may be manufactured by mixing a powder of the rigid, conducting spheres into the adhesive substance to form a paste or suspension. Additional solvent may be added to the mixture to maintain proper bonding material viscosity. For example, to make a high temperature, hermetic, conductive seal, the conductive particles may be mixed with a paste of glass frit. The mixture may then be applied to the first wafer and heated to remove the solvent of the glass frit. The first wafer may then be assembled with the second wafer and the assembly placed under pressure. Heat may be applied to fuse the frit and activate the getter. As the frit fuses and the getter outgasses, the wafers approach each other to a minimum distance defined by the diameter of the conductive particles. The assembly may then be cooled and the wafers singulated to form the encapsulated MEMS devices.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

The systems and methods described herein may be particularly applicable to encapsulated MEMS devices. However, it should be understood that this embodiment is exemplary only, and that the methods disclosed herein may be used in any application wherein devices are formed on a first wafer and encapsulated with a second wafer.

Figure 1:
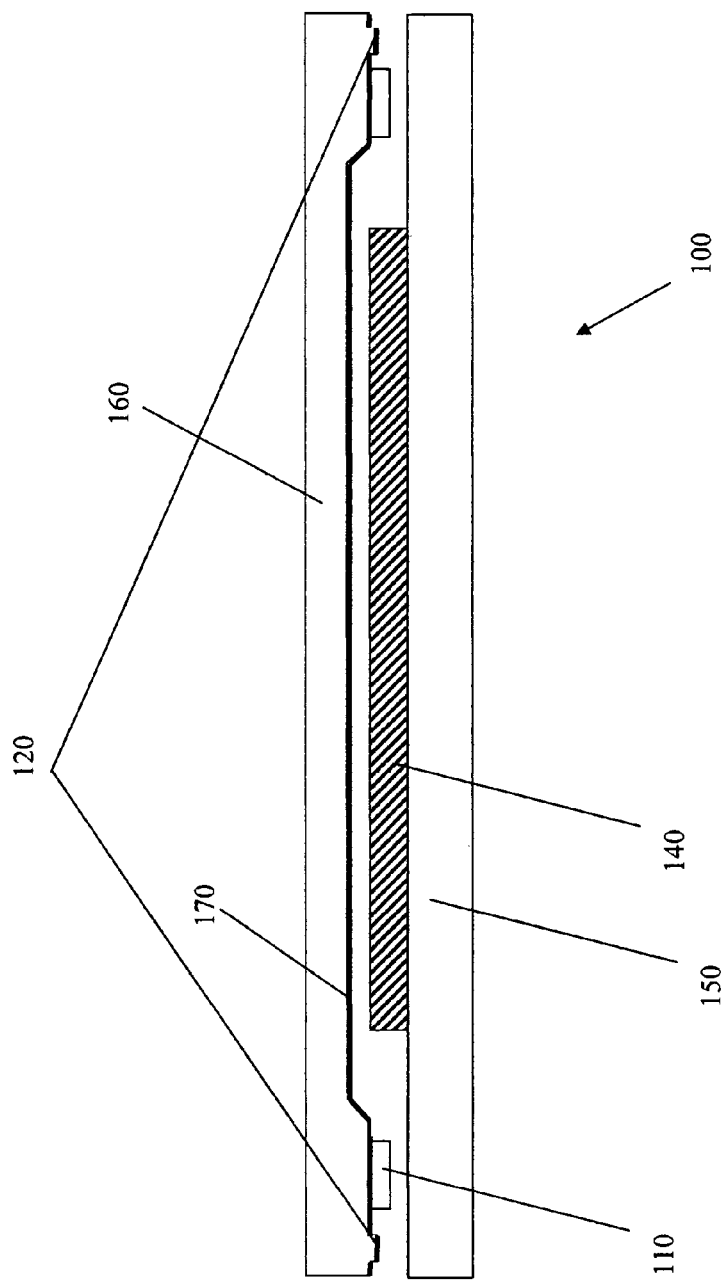
FIG. 1 is a diagram showing a prior art first wafer and second wafer assembly.
Figure 2:
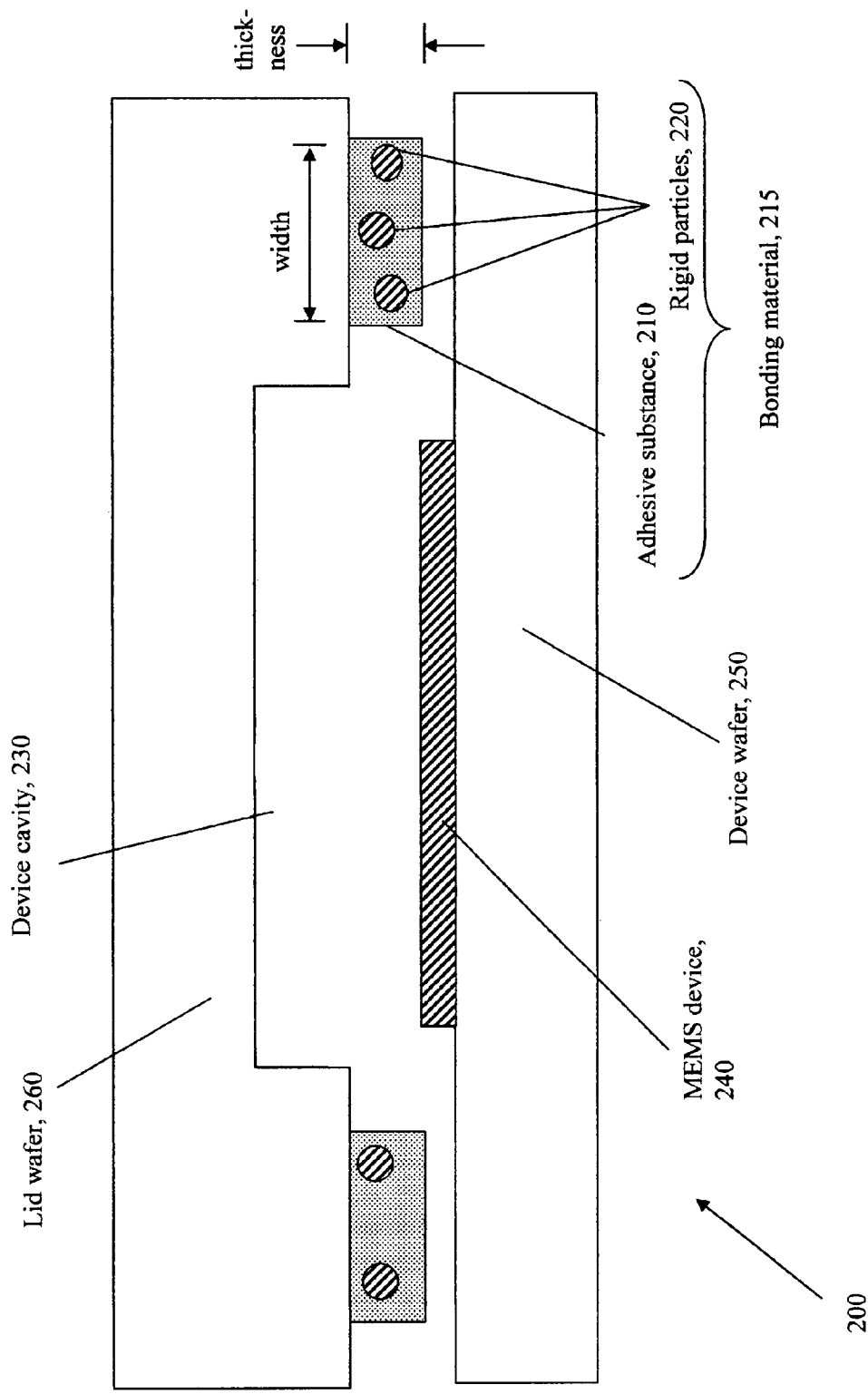
FIG. 2 is diagram showing a first wafer and second wafer using a first exemplary bonding material with embedded rigid particles before bonding.

FIG. 2 shows an exemplary assembly 200 using a first embodiment of a bonding material with embedded rigid particles. Although not shown in FIG. 2, it should be understood that the procedure described below may be performed in a wafer bonding chamber, equipped with a wafer chuck to hold the second wafer and a pressure chuck to deliver pressure between a sealing first wafer and the second wafer. The wafer bonding chamber may also be provided with a heat source to provide heat to melt, fuse or cure the adhesive.

A first wafer 260 is formed with a device cavity 230 by reactive ion etching, for example. The device cavity 230 may be made sufficiently deep to provide clearance for a MEMS device and its movement. The MEMS device 240 is formed on a second wafer 250, using lithographic processes well known in the MEMS art. For example, the MEMS device 240 may be a switch, such as that described in U.S. patent application Ser. No. 11/386,733, incorporated by reference herein in its entirety. Since the details of the MEMS device 240 are not necessary to understanding this invention, the MEMS device 240 is depicted only schematically in FIG. 2. It should be understood that the MEMS device 240 may be any of an actuator, a sensor, a switch, a signal filter, or the like. Alternatively, in applications in which the diameter of the rigid particle is sufficient to provide clearance over the MEMS device 240, no device cavity may be needed and the first wafer 260 may simply be a flat, unetched substrate.

A bonding material 215 may be applied to an unetched surface of the first wafer 260, and in a perimeter around the device cavity 230 and MEMS device 240. The bonding material 215 may include an adhesive substance 210 with embedded rigid particles 220. The bonding material 215 may be applied to one or both of the first wafer 260 and second wafer 250 by, for example, using silk screening techniques. In one embodiment, the bonding material 215 is forced through a patterned silk screen or a stencil with a squeegee onto the surface of first wafer 260. Alternatively, the bonding material 215 may be deposited by dipping, spraying, painting, or extrusion, for example. The thickness of the bonding material 215 as applied (before assembly with the second wafer 250) may be about 25 μm to about 50 μm. The width of the bonding material 215 as applied may be about 125 μm. The adhesive substance of the bonding material 215 provides the adhesion forces necessary to bond the first wafer 260 to the second wafer 250, and the rigid particles 220 define the minimum separation between the first wafer 260 and the second wafer 250.

Depending on the material used for the adhesive substance 210, a number of steps may be taken to prepare the adhesive substance 210 for adhesion to the second wafer. For example, if the adhesive substance 210 is a glass frit with a solvent vehicle such as amyl acetate, the bonding material 215 may be air dried over night or on a hot plate at about 100 degrees centigrade for two hours. Any remaining organic material and/or water solvent may then be removed from the bonding material 215 by air drying at 290 degrees centigrade for about two hours. Finally, the glass frit may be pre-fired in the wafer bonding chamber by air drying for 10 minutes at about 400 to at least about 450 degrees centigrade. The pre-firing seals the glass frit so that it does not become contaminated during any subsequent processing.

After preparation, the first wafer 260 with the bonding material 215 may be placed against the second wafer 250 and aligned so that it is positioned properly above the MEMS devices 240. The first wafer may then be clamped to the second wafer in the proper position, to form the wafer assembly 200, and loaded into a wafer chuck in the wafer bonding chamber.

The sealing environment in the wafer bonding chamber may be changed from air to an encapsulating gas which may be the preferred environment for the operation of the MEMS device. For example, if the MEMS device 240 is an electrical switch, it may be desirable to place the MEMS switch in an environment which discourages electrical arcing. Such environments may include, for example, sulfur hexafluoride ($SF_6$), hydrogen ($H_2$), carbon dioxide ($CO_2$), nitrogen ($N_2$), helium (He) and neon (Ne), vacuum and partial vacuum. The gas pressure may be anywhere from sub-ambient or even high vacuum to super-ambient, for example 70 psi, depending on the requirements of the application. The environment may be maintained permanently within the encapsulation by making the seal hermetic, by, for example, using glass frit as the adhesive substance. Furthermore, as described further below, if a vacuum or partial vacuum environment is required, a getter material, which absorbs ambient gases may be included in the MEMS device cavity 230 to maintain the low pressure.

Pressure may be applied to the assembly 200 in the wafer bonding chamber by, for example, squeezing the first wafer 260 against the second wafer 250. The force of the first wafer 260 against the second wafer 250 may be, for example, about 50 N to 4000 N applied to a pair of six inch diameter wafers. The assembly 200 may then be simultaneously heated to cure, fuse, or melt the adhesive. When the adhesive is molten, the pressure causes the first wafer 260 to approach the second wafer 250 until a minimum separation is reached, which is defined by the size of the embedded rigid particles.

Figure 3:
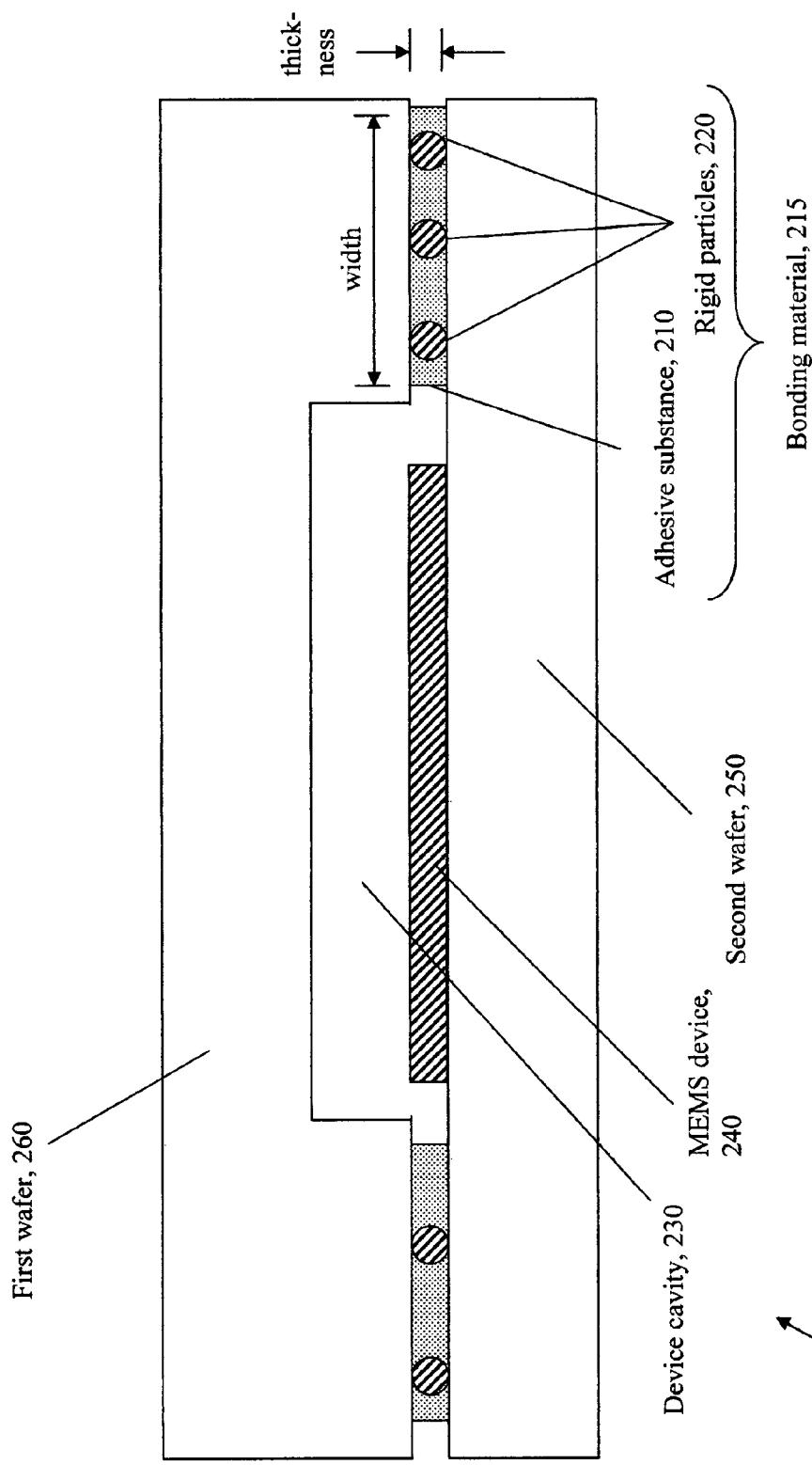
FIG. 3 is a diagram illustrating a first wafer and second wafer using the exemplary bonding material with embedded rigid particles after assembly and bonding.

The timing of the application of heat to the assembly 200 may depend on the type of adhesive substance 210 used for the application, and may be simultaneous with the application of pressure, or may be applied after the pressure is applied. For example, if the adhesive substance 210 is liquid to begin with, such as epoxy, the application of heat to cure the epoxy may take place after the application of pressure to squeeze the first wafer 260 against the second wafer 250. However, if the adhesive substance is not normally in liquid form, the heat may be supplied before, or simultaneously with the pressure. For example, if the adhesive substance is glass frit, temperatures of about 450 degrees centigrade may be sufficient to fuse the glass frit, and the heat is applied simultaneously with the pressure. The assembly may be held at a temperature of between about 400 to about 450 degree centigrade for about 10 minutes or more, to fuse the glass frit. The fusing of the glass frit allows the first wafer to approach the second wafer to a distance at which the presence of the rigid particles defines the minimum separation between the first wafer and the second wafer. The situation is depicted in FIG. 3. The assembly 200 may then be cooled and removed from the wafer bonding tool for singulation.

The embedded rigid particles may be spherical in shape, with diameters of between about 1 μm and about 100 μm. In one embodiment, the embedded rigid particles are sapphire spheres of 10 μm diameter. Accordingly, the minimum distance between the first wafer 260 and the second wafer 250 may be the diameter of the sapphire spheres, or 10 μm. The width of the bonding material after the bonding of the first wafer 260 to the second wafer 250 may be about 200 μm.

While the first embodiment of the bonding material with embedded rigid particles is described as a glass frit paste mixed with sapphire spheres, it should be understood that any of a number of different materials may be used as the adhesive substance or as the rigid particles. Any adhesive substance which is liquid or may become molten during processing, and is capable of adhering the surface of the first wafer to the surface of the second wafer, may be used as the adhesive substance. For example, a solder material, which melts at between about 150 and about 200 degrees centigrade may be used. Metal materials, such as indium, gallium/indium, gold/tin and gold/indium, alloys may be used as a lower temperature adhesive substance, or in applications wherein a conductive seal is desired. An embodiment which uses conductive particles in an insulating adhesive to provide a conductive path between the first wafer and the second wafer is described further below. In other applications not necessarily requiring a hermetic seal, a glue, cement or epoxy may be used as the adhesive substance.

Furthermore, any number of materials may be chosen for the rigid particles. The term "rigid particle" should be understood to mean a substantially incompressible particle whose outer shape does not deform substantially under operating or manufacturing conditions. For example, alumina, silica, metal or diamond may be used for the rigid particles. The rigid particles need not necessarily be spherical, but may instead have other shapes, for example rod shapes, as long as at least one dimension is well defined or controlled. However, in many applications, spherical particles are preferred because of the likelihood that a single layer will be formed between the first wafer and the second wafer, such that the minimum separation between the first wafer and the second wafer is predictable and repeatable. Any material which maintains its rigidity during the processing steps of the wafer bonding, does not dissolve in or interfere with the action of the adhesive substance, and has a well defined dimension may be used as the rigid particle material.

The wafer bonding material with embedded rigid particles may be manufactured simply by mixing a powder of the rigid particle particles with the adhesive substance. The relative amount of adhesive substance used in the mixture may be an amount sufficient to ensure a hermetic seal around the rigid particles in the bonding material.

Glass frit, for example, is widely known to produce a reliable hermetic seal when the frit is heated sufficiently to fuse the glass frit particles, such that they flow together and form a seal. A glass frit paste may be a suspension of glass particles (<10 µm) with a suitable solvent as the vehicle. The solvent vehicle may be amyl acetate or denatured alcohol with about 1.2% nitrocellulose or equivalent added as an organic binder, which is evaporated before bonding. Bonding occurs when the remaining glass frit particles are heated to a point at which the particles fuse together. At this point, the glass particles form the hermetic seal upon cooling.

If a bonding material is made from rigid particles of sapphire spheres, and the adhesive substance is a glass frit paste, the bonding material with embedded rigid particles may be made by mixing a volume percentage of between about 3% and about 50% of the sapphire spheres with the glass frit paste. Extra solvent may be added to maintain the viscosity of the bonding material at a level similar to that (within about 50%) of the glass frit adhesive substance prior to introduction of the rigid particle powder. The mixing may be performed by hand, or by a machine supplying agitation or magnetic mixing, for example.

Figure 4:
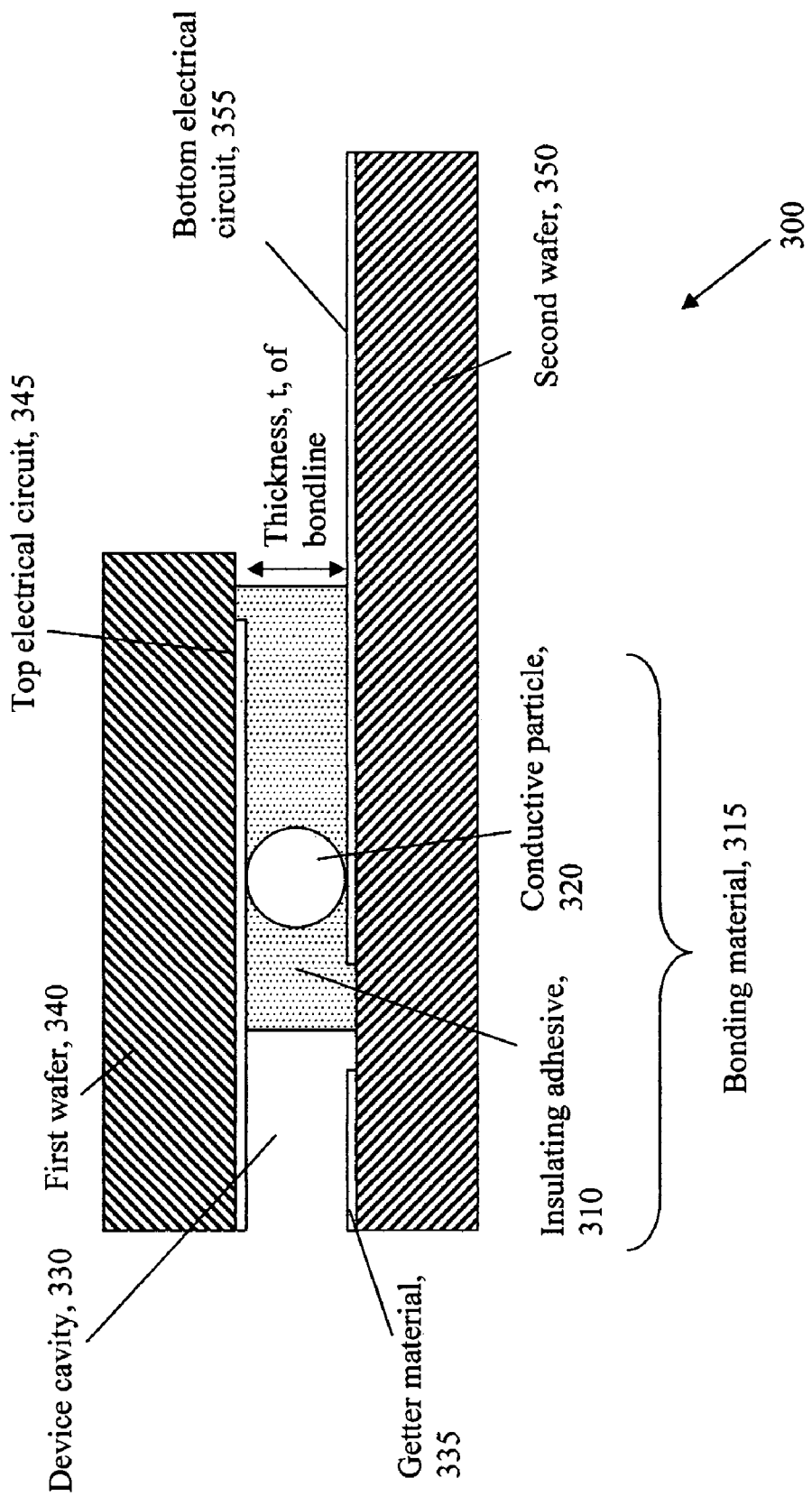
FIG. 4 is a cross sectional view of a second exemplary embodiment of a bonding material using conductive particles in an insulating adhesive.

FIG. 4 is a cross sectional view of a second exemplary embodiment of a wafer assembly 300 using a wafer bonding material with embedded rigid particles. In the second exemplary embodiment of the wafer assembly 300, the embedded rigid particles may be conductive particles 320 embedded in an insulating adhesive 310 to form the wafer bonding material 315. The conductive particles 320 may provide a conductive path between a top electrical circuit 345 formed on a first wafer 340, and a bottom electrical circuit 355 formed on a second wafer 350. The top electrical circuit 345 and bottom electrical circuit 355 may be aluminum (Al), gold (Au) or titanium/tungsten (Ti/W) lithographically patterned on the top wafer 340 or the bottom wafer 350, respectively. The conductive particles 320 may be aluminum (Al), gold (Au), copper (Cu), nickel (Ni), tungsten (W), or platinum (Pt), for example. Alternatively, the conductive particles 320 may be metal-coated dielectric spheres, such as gold-coated sapphire balls, or they may be hollow metal spheres. The conductive particles may have a diameter between about 1 µm and about 100 µm, and may be more preferably about 30 µm. The insulating adhesive 310 may be, for example, glass frit or an insulating polymer.

The conductive particles 320 may have a higher melting temperature than the insulating adhesive, such that they may retain their shape even as the adhesive around them melts and flows. The conductive particles 320 may be substantially spherical with a diameter of about 30 µm, so that the final bond thickness may be about 30 µm. A spherical shape may help ensure that a single layer of conductive particles 320 is formed separating the first wafer 340 from the second wafer 350. Accordingly, the conductive particles 320 may define the spacing between the first wafer 340 and the second wafer 350, as in the first exemplary embodiment 200. However, in the second exemplary embodiment 300, the conductive particles 320 may also provide a conductive path between the top electrical circuit 345 on the first wafer 340 and the bottom electrical circuit 355 on the second wafer 350.

Figure 5:
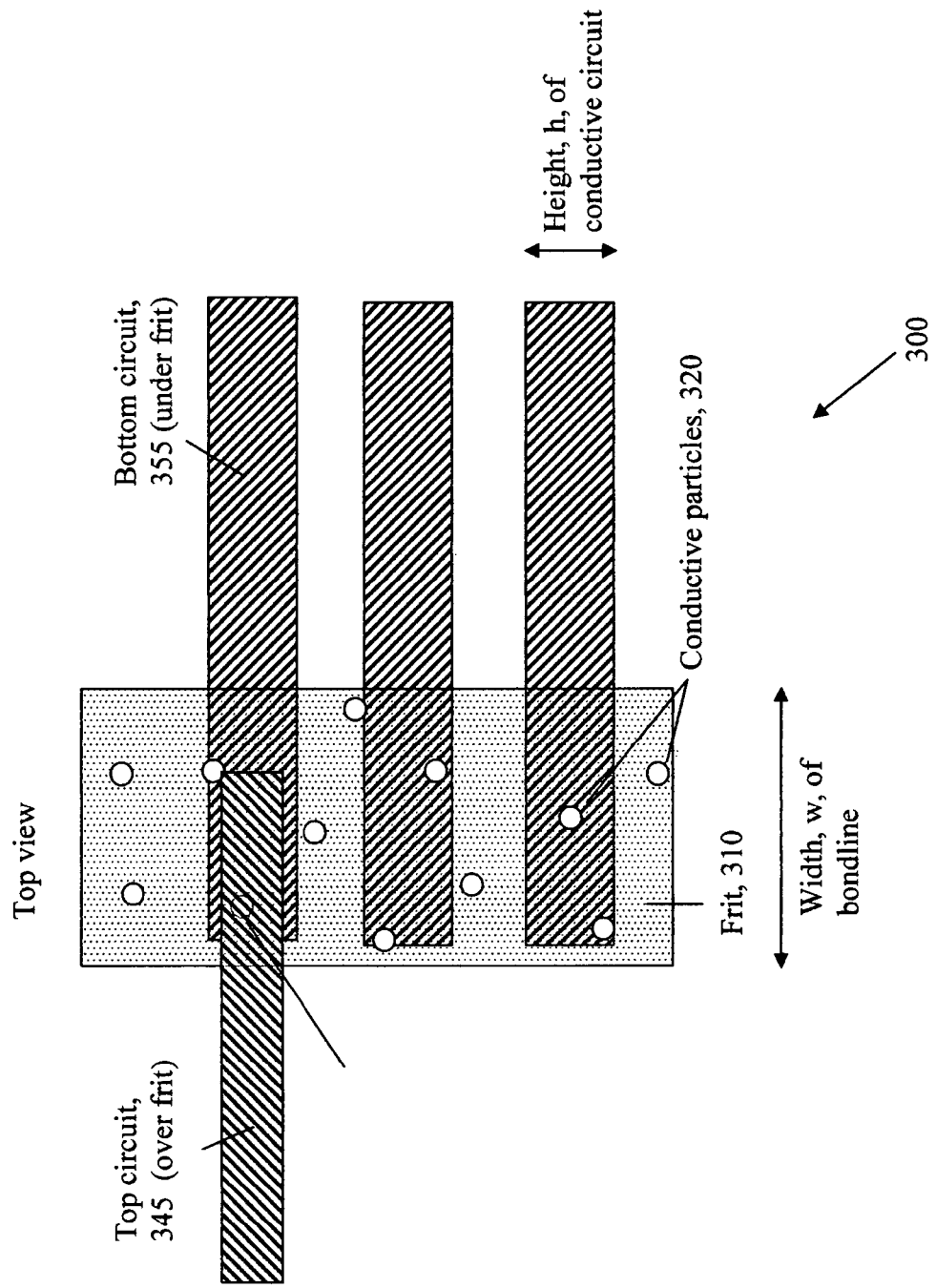
FIG. 5 is a plan view of the second exemplary embodiment of the bonding material using conductive particles.

FIG. 5 is a plan view of the second exemplary embodiment of the wafer assembly 300 using the wafer bonding material 315 with embedded conductive particles 320. As shown in FIG. 5, the conductive particles 320 may form a conductive path between the top electrical circuit 345 and the bottom electrical circuit 355. The conductive particles 320 may be dispersed sparsely in the insulating adhesive 310, as long as there is at least one conductive particle 320 disposed between the top electrical circuit 345 and the bottom electrical circuit 355, within the insulating adhesive. The amount by weight of conductive particle powder to be mixed with the polymer adhesive 310 may depend on the volume of the conductive particles compared to the volume of the insulating adhesive required for the width, height and thickness of the bond line between the conductive circuits, and the relative densities of the materials. For example, in one exemplary embodiment, as shown in FIG. 5 an adhesive in the bond line region between the top electrical circuit 345 and the bottom electrical circuit 355 may have a width, w, of about 200 µm, a height, h, of about 75 µm and a thickness, t, of about 30 µm. When using spheres of diameter about 30 µm, the volume ratio of a conductive particle to the insulating adhesive in the bonding material in the bond line region may be between about 0.1% and about 50%, and in this case, is about 3%. Since the density of gold (19,300 kg/m$^3$) is about seven times that of silicon dioxide (2600 kg/m$^3$) of the glass frit, mixing at least about 20 parts by weight of the particulate powder with about 100 parts by weight of the glass frit adhesive material may be adequate to provide at least one conductive particle within the bond material volume between the top circuit 345 and the bottom circuit 355. However, to assure that there is at least one conductive particle between the top circuit 345 and the bottom circuit 355, the loading of particulate powder may be doubled, so that about 40 parts by weight of particulate powder may be added to 100 parts by weight of adhesive material.

Figure 6:
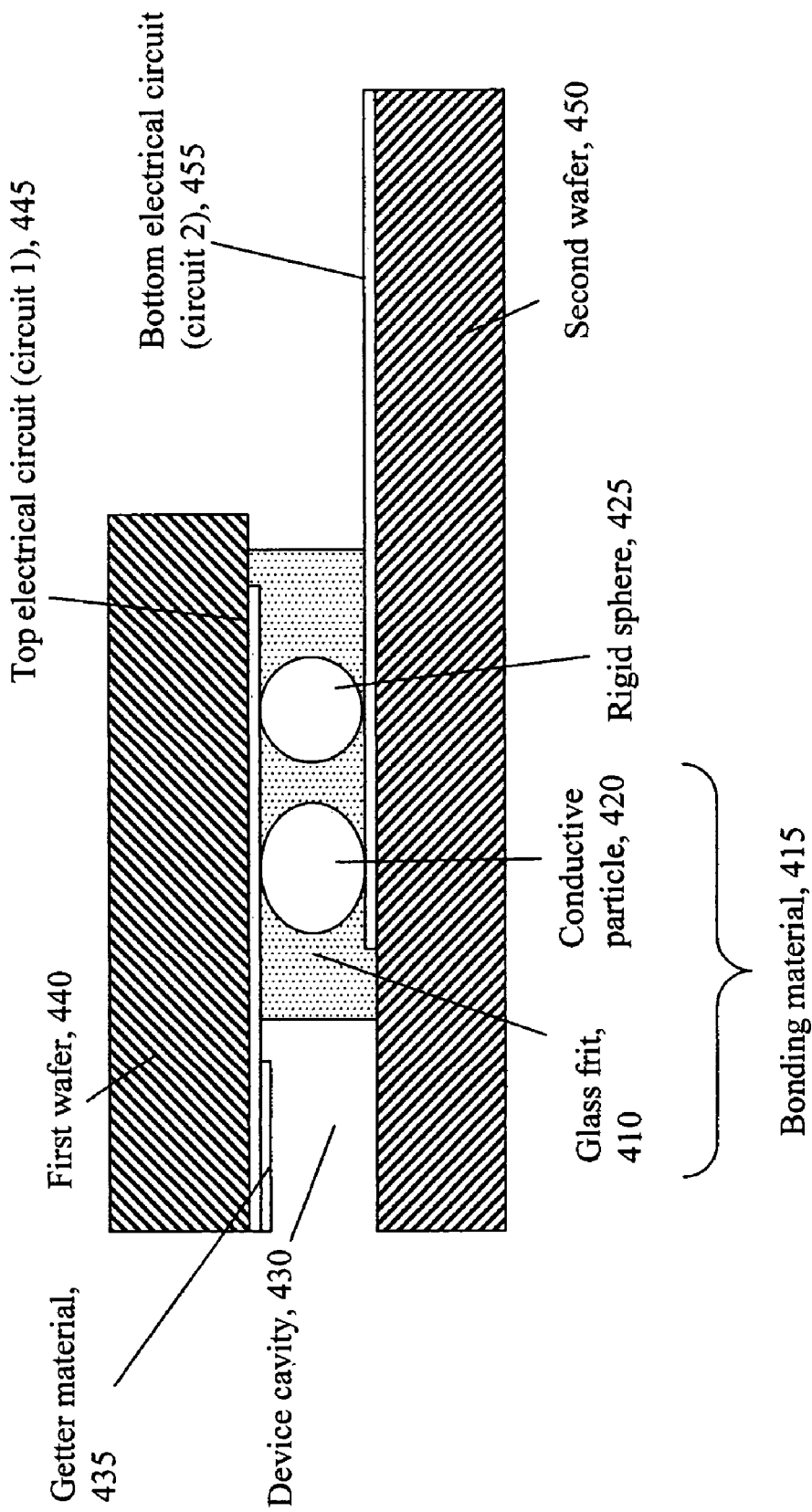
FIG. 6 is a cross sectional view of a third exemplary embodiment of a bonding material using two populations of rigid particles.

FIG. 6 shows a third exemplary embodiment of a wafer assembly 400 using a wafer bonding material with embedded rigid particles. In the third exemplary embodiment, two populations of embedded rigid particles may be used in the wafer bonding material 415, a first population of conductive particles 420, accompanied by a second population 425 of rigid particles. The second population 425 of rigid particles may have a characteristic dimension at least as small as the dimension of the conductive particles, and they may be harder than the conductive particles. When bonding the first wafer 440 to the second wafer 450, the conductive particles 420, which may be more malleable than the second population of rigid particles 425, may deform slightly because of the pressure between the first wafer 440 and the second wafer 450. The conductive particles 420 may continue to deform until contact is made with the population of smaller rigid particles 425. A characteristic dimension, such as the diameter or the smaller rigid particles 425, may then define the minimum separation between the first wafer 440 and the second wafer 450. Thus, the conductive particles may become oblate, whereas the population of smaller rigid particles remains substantially spherical. The ability of the conductive particles 420 to deform slightly may also help accommodate non-uniformities in the surfaces of the two wafers, or variation in the precise dimensions of the conductive particles 420, while still providing a conductive path between the two wafers.

Using this two-population approach, the second population of smaller, spherical particles may determine the minimum separation of the first wafer 440 and the second wafer 450, rather than the conductive particles 420. Thus, using the third exemplary embodiment of the wafer assembly 400, the function of providing the electrical connection between the first wafer 440 and the second wafer 450 may be performed by the first population of rigid particles, whereas the function of determining the separation distance between the first wafer 440 and the second wafer 450 may be performed by the second population of particles. By separating these functions, the materials of the two populations may be selected to best meet the function they serve, resulting in better performance than with a single population of particles. For example, a more malleable material with good electrical transport properties may be chosen for the conductive particle, whereas a dimensionally stable material which can be formed into regular, smooth spheres may be chosen for the rigid particles.

In one exemplary embodiment, the insulating adhesive 410 in the wafer bonding material 415 may again be glass frit. In this exemplary embodiment, the conductive particles may be gold (Au), of diameter about 30 μm, whereas the second population of particles may be sapphire of diameter about 20 μm. Both populations of particles may be embedded in the glass frit, by mixing the particulate powders with a glass frit paste. An exemplary recipe for the mixing of the two populations of particles may be 40 parts by weight of 30 μm spherical gold particles, 3 parts by weight of 20 μm sapphire particles and 100 parts by weight of glass frit paste.

The second and third exemplary embodiments of wafer assemblies 300 and 400 may be particularly convenient in applications wherein the environment sealed within the device cavity is vacuum. For example, for applications involving infrared (IR) light generation or detection by a microstructure, an ambient environment around the microstructure may be required to be less than about 10 Torr, and more preferably less than about 10 mTorr, in order to reduce the absorption of the IR light by the environment, and minimize the heat lost to the environment. For the purposes of clarity, the description which follows is directed to the second exemplary embodiment 300 of the wafer assembly, however, it should be understood that it may apply as well to the third exemplary embodiment 400.

In order to maintain a low pressure within device cavity 330, a getter material 335 may be installed within the device cavity 330. The getter material 335 may be any material capable of absorbing gases which may be emitted from walls and surfaces of the device cavity 330, or the materials used in the construction of the device. In order to activate the getter material, it may be heated to a temperature at which all previously absorbed materials are desorbed from the getter material, and evacuated from the cavity. The getter material is then ready to provide its function of absorbing gases emitted into the vacuum cavity by the components or surfaces of the device.

The deposition of the getter material 335 may be performed, for example, according to the systems and methods described in U.S. Pat. No. 6,897,551, incorporated by reference herein in its entirety. The getter material 335 may include, for example, zirconium, titanium, vanadium, iron, niobium or tantalum, or alloys thereof combined with other transition elements, rare earths or aluminum. Such materials have a strong chemical affinity towards gases such as hydrogen, oxygen, water, organics, carbon oxides and, in some cases, nitrogen. Known getter materials are described in, for example, U.S. Pat. No. 4,312,669 and U.S. Pat. No. 5,961,750, incorporated by reference herein in their entirety. These materials may remove such gases from the device cavity 330 by absorption, after the first wafer 340 is bonded to the second wafer 350. The getter material 335 may typically be between about 0.5 μm and about 3.0 μm thick.

The getter material 335 may be deposited with a layer of gold (not shown) covering the getter material 335. The purpose of the gold film may be to prevent the getter material from absorbing impurity gases and becoming saturated, before it is installed in the device cavity 330 with a MEMS device, for example. After installation in the device cavity 330 as described below, the getter material 335 with the gold layer may be heated to a temperature at which the gold film diffuses into the getter material 335, exposing the surface of the getter material 335 to the environment in the device cavity 330. At this point, the getter material 335 may begin its operation. Alternatively, the getter material 335 on the first wafer 340 may be heated to desorb any absorbed gases, before installation with the devices on the second wafer 350. In either case, rather high temperatures, in excess of about 400 degrees centigrade may be required to activate the getter material 335 after deposition of the getter material 335 on a wafer 350, and bonding of that wafer to another wafer 340.

In the embodiments shown in FIGS. 4-6, the getter material may be activated at the same time that the glass frit is fused to bond the first wafer 340 to the second wafer 350. This activation may occur because the glass frit may be required to be heated to a temperature in excess of the 400 degrees centigrade required to activate the getter material 435. What follows is a description of an exemplary method for activating the getter material 435 and bonding the first wafer 340 to the second wafer 350 using the insulating adhesive material 310 with conductive particles 320.

Having deposited the getter material 335 over the wafer 340 or 350, the first wafer 340 is ready for assembly with the second wafer 350. The first wafer 340 may first be aligned to the second wafer 350, so that the device cavity 330 is properly registered over the second wafer 350, and the top electrical circuit 345 is properly registered over the bottom electrical circuit 355. With the first wafer 340 in the adjusted position relative to the second wafer 350, the first wafer 340 may be clamped to the second wafer 350, to form the wafer assembly 300, shown in FIG. 4. The wafer assembly 300 may then be loaded into a wafer bonding tool, which is then evacuated or may have the ambient air replaced with a preferred gas environment. Useful gas environments may include sulfur hexafluoride ($SF_6$), nitrogen ($N_2$), carbon dioxide ($CO_2$), helium (He), argon (Ar), and neon (Ne). The environment may include vacuum and partial vacuum and high gas pressures, in excess of an atmosphere.

In the case of the low pressure environments, the getter material 335 may operate to reduce or eliminate unwanted contaminants such as oxygen, water vapor, carbon oxides and organics such as methane from the environment. In the case of a vacuum or partial vacuum environment, the getter material 335 may operate to reduce the overall base pressure in the device cavity 330, due to outgassing of various impurities from the first wafer 340 or second wafer 350, or from the components of the devices within the device cavity 330. For example, in the above-mentioned IR application, a getter may by used to maintain the low pressure environment at or below about 10 Torr, and more preferably at or below about 10 mTorr. In a high pressure noble gas environment, the getter may be used to remove unwanted impurities from the environment.

The wafer bonding tool may be equipped with a wafer chuck to hold the wafer assembly 300 and a pressure chuck which may apply pressure to the wafer assembly 300. The wafer bonding tool may also have a heat source, which may apply heat to the adhesive that may bond the first wafer 340 to the second wafer 350. For example, if the adhesive is a glass frit, the wafer bonding tool may heat the wafer assembly 300 to a temperature of about 450 degrees centigrade for at least about 10 minutes, and apply a force between the first wafer 340 and the second wafer 350 of about 50 N to about 4000 N. This temperature may be sufficient to fuse the particles of the glass frit together, thus forming the hermetic seal.

This heating step for sealing the adhesive may also serve to diffuse the gold layer over the getter material 335, as described above, or otherwise activate the getter material 335. After the first wafer 340 is sealed with the second wafer 350, enclosing either the preferred gas or vacuum environment within the device cavity 330, the wafer assembly 300 may be removed from the wafer bonding tool. Upon cooling, the individual devices may be singulated from the wafer assembly 300, to form the encapsulated individual device packages.

Figure 7:
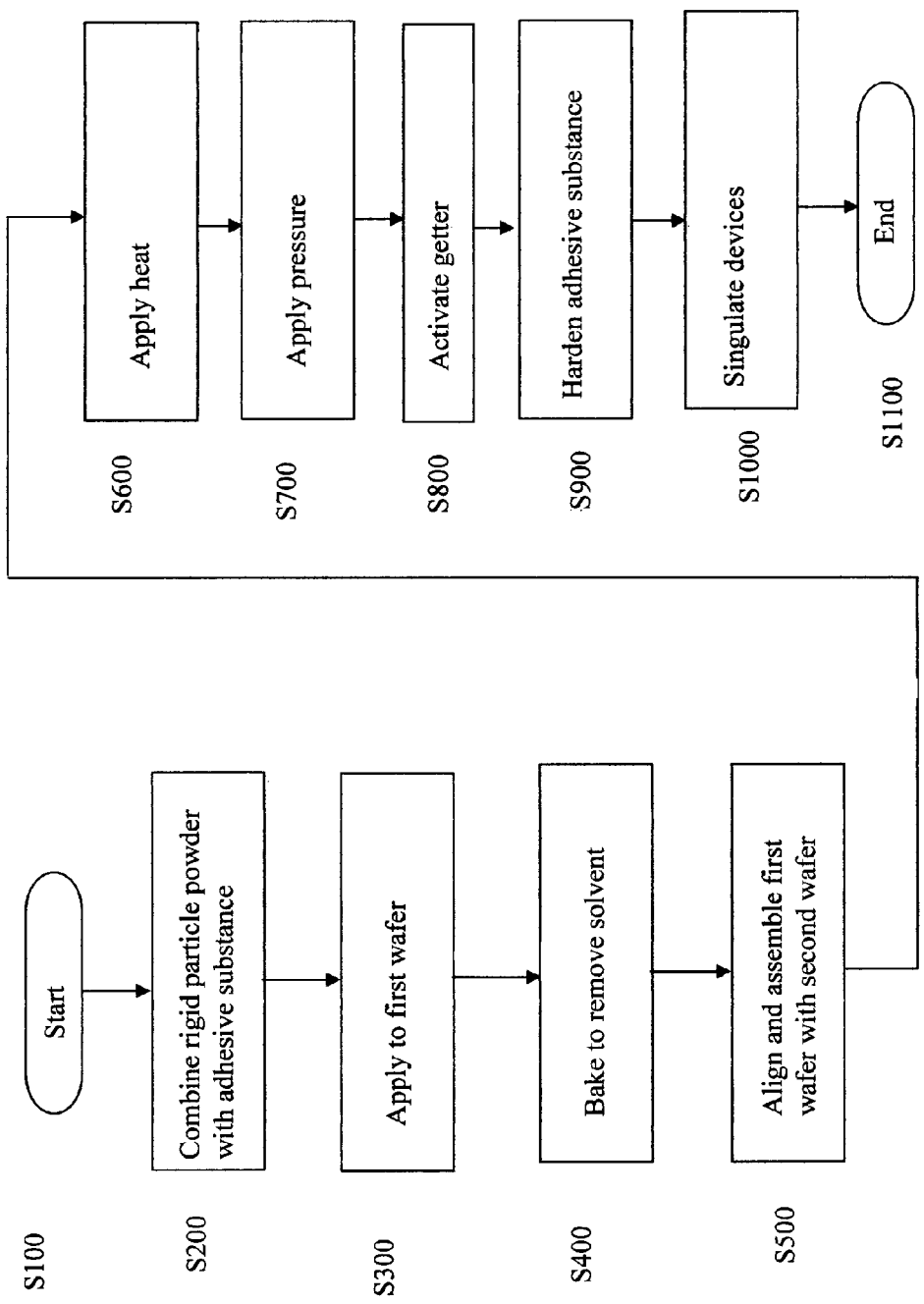
FIG. 7 is an exemplary flowchart illustrating a method for preparing and using the bonding material with embedded rigid particles and its application to a first wafer and a second wafer.

FIG. 7 is a flowchart illustrating an exemplary method for the preparation and use of the adhesive with embedded rigid particles. The method begins in step S100, and proceeds to step S200, wherein a powder of the conductive, rigid particles is mixed with the adhesive substance. The adhesive substance may be a glass frit suspended in a vehicle solvent to form a paste, for example. In step S300, the bonding material is applied to the first wafer. The bonding material may be applied through either a silk screen or a stencil, for example, to the surface of the first wafer. In step S400, the first wafer with the adhesive substance is baked to remove any extra solvent from the adhesive substance. The wafer may be baked at, for example, 290 degrees centigrade for about 2 hours. In step S500, the first wafer is aligned with the second wafer and affixed to the second wafer using, for example, a clamp to form a wafer assembly. The device cavity between the first wafer and the second wafer may then be evacuated after step S500, by evacuating the wafer bonding chamber holding the wafer assembly, or filling the device cavity with the preferred environment. In step S600, heat may be applied to the bonding material to melt or fuse the adhesive substance, if the adhesive substance is not already liquid. In step S700, pressure or squeezing is applied between the first wafer and the second wafer, until a minimum separation is reached defined by the conductive particles or the rigid particles. In step S800, the getter is activated by the applied heat. In step S900, the adhesive substance is hardened by, for example, cooling or curing, to bond the first wafer to the second wafer. In step S1000, the devices are singulated from the wafer assembly. The method ends in step S1100.

It should be understood that the method illustrated in FIG. 7 is exemplary only, and that not all the steps make be required to practice the method, nor are the steps required to be performed in the order shown. For example, if the adhesive is ordinarily liquid, the heat applied in step S600 may be omitted. If the adhesive material is ordinarily solid or particulate, the heat may be applied before, or simultaneously with the pressure applied in step S700. Furthermore, the devices may not be singulated, so that step S1100 may be omitted or practiced later.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. While the embodiment described above relates to a microelectromechanical device, it should be understood that the techniques and materials described above may be applied to any of a number of other devices, such as semiconductor integrated circuit devices. Furthermore, details related to the specific method steps are intended to be illustrative only, and the invention is not limited to such embodiments. Accordingly, the exemplary implementations set forth above, are intended to be illustrative, not limiting.

What is claimed is:

1. A bonding material which bonds a first wafer to a second wafer, and provides a conductive path between the first wafer and the second wafer, comprising:
   an insulating adhesive which adheres the first wafer to the second wafer; and
   at least one conductive particle in the insulating adhesive, and at least one additional rigid particle in the insulating adhesive, wherein the additional rigid particle has a characteristic dimension smaller than a dimension of the at least one conductive particle, and wherein the characteristic dimension of the at least one additional rigid particle defines the minimum separation between the first wafer and the second wafer.

2. The bonding material of claim 1, wherein the at least one conductive particle comprises at least one of aluminum, gold, platinum, tungsten, copper and nickel, and are distributed uniformly throughout the insulating adhesive.

3. The bonding material of claim 1, wherein the at least one additional rigid particle is non-conductive.

4. The bonding material of claim 1, wherein the insulating adhesive further comprises at least one of glass frit and a polymer.

5. The bonding material of claim 1, wherein the bonding material is disposed in a layer around a perimeter of a MEMS device fabricated on at least one of the first and the second wafer.

6. The bonding material of claim 1, wherein a volume ratio of the at least one conductive particle to the insulating adhesive in the bonding material is between about 0.1% and about 50%.

7. The bonding material of claim 1, wherein a material of the at least one additional rigid particle comprises at least one of sapphire, alumina, silica, metal and diamond.

8. The bonding material of claim 7, wherein a material of the at least one conductive particle is more malleable than a material of the at least one additional rigid particle.

9. The bonding material of claim 1, wherein the at least one conductive particle is spherical, having a diameter of between about 1 μm and about 100 μm.

10. A device, comprising:
    the bonding material of claim 1;
    the microstructure formed on at least one of the first wafer and the second wafer, and enclosed between the first wafer and the second wafer; and
    a getter material formed on at least one of the first wafer and the second wafer, which removes gases from an environment around the microstructure.

11. The microdevice of claim 10, wherein the getter material comprises at least one of zirconium, titanium, vanadium, niobium, tantalum and iron, and is between about 0.5 μm and about 3 μm thick.

12. A method for bonding a first wafer to a second wafer, comprising:
    providing an insulating adhesive;
    providing a plurality of conductive particles;
    providing at least one additional rigid particle in the insulating adhesive, wherein the additional rigid particle has a characteristic dimension smaller than a dimension of the at least one conductive particle;
    mixing the conductive particles into the insulating adhesive to form a bonding material;
    applying the bonding material to at least one of a first wafer and a second wafer;
    squeezing the first wafer and the second wafer until a minimum separation is reached defined by a dimension of the at least one additional rigid particle; and
    hardening the insulating adhesive in the bonding material, wherein within the hardened adhesive, the at least one conductive particle forms a conductive path between the first wafer and the second wafer.

13. The method of claim 12, wherein a material of the at least one additional rigid particle comprises at least one of sapphire, alumina, silica, metal and diamond.

14. The method of claim 12, further comprising:
forming a getter material on at least one of the first wafer and the second wafer.

15. The method of claim 14, further comprising:
heating the insulating adhesive to fuse the insulating adhesive and activate the getter material; and
cooling the insulating adhesive to harden the insulating adhesive.

16. The method of claim 15, wherein heating the insulating adhesive to fuse the insulating adhesive and activate the getter material comprises:
heating the insulating adhesive to at least about 400 degrees centigrade for at least about 10 minutes.

17. The method of claim 12, further comprising:
mixing a solvent into the bonding material, in an amount sufficient to maintain a viscosity of the bonding material at a level within about 50% of a viscosity of the insulating adhesive.

18. The method of claim 12, further comprising:
providing an environment around the first wafer and the second wafer including at least one of air, $SF_6$, He, $N_2$, $H_2$, Ne, vacuum or partial vacuum around the first wafer and the second wafer.

19. The method of claim 18, wherein the environment is provided at a pressure of less than about 10 Torr.

20. The method of claim 12, wherein applying the bonding material to at least one of the first wafer and the second wafer comprises forcing the bonding material through at least one of a silk screen and a stencil.

* * * * *